United States Patent [19]
Lehman et al.

[11] Patent Number: 5,801,957
[45] Date of Patent: Sep. 1, 1998

[54] IMPLICIT TREE-MAPPING TECHNIQUE

[75] Inventors: Eric Lehman, Marlborough; Joel Joseph Grodstein, Arlington; Heather Harkness; Kolar Kodandapani, both of Shrewsbury, all of Mass.

[73] Assignee: Digital Equipment Corporation, Maynard, Mass.

[21] Appl. No.: 551,504

[22] Filed: Nov. 1, 1995

[51] Int. Cl.$^6$ .................................................. G06F 17/50
[52] U.S. Cl. .......................................... 364/489; 364/488
[58] Field of Search ................................. 364/488, 489, 364/490, 491

[56] References Cited

U.S. PATENT DOCUMENTS

| | | | |
|---|---|---|---|
| 4,703,435 | 10/1987 | Darringer et al. | 364/489 |
| 5,282,147 | 1/1994 | Goetz et al. | 364/489 |
| 5,402,356 | 3/1995 | Schaefer et al. | 364/489 |
| 5,432,707 | 7/1995 | Leung | 364/489 |
| 5,461,574 | 10/1995 | Matsunaga et al. | 364/489 |
| 5,491,640 | 2/1996 | Sharma et al. | 364/488 |
| 5,544,066 | 8/1996 | Rostocker et al. | 364/489 |
| 5,572,436 | 11/1996 | Dangelo et al. | 364/489 |

OTHER PUBLICATIONS

Grodstein, Joel, et al., "Optimal Latch Mapping and Retiming within a Tree", 1993 IEEE/ACM International Conference on Computer–Aided Design. Nov. 7–11, 1993, pp. 242–243.

Lockyear, Brian, et al., "The Practical Application of Retiming to the Design of High–Performance Systems", 1993 IEEE/ACM International Conference on Computer–Aided Design, Nov. 7–11, 1993, pp. 288–295.

E. Detjens et al., "Technology Mapping in MIS," 5$^{th}$ Annual European Computer Conference, May 1991, pp. 116–119.

J.R. Fox et al., "The Role of Synthesis in an ASIC Design Environment," 1989 International Conference, [Jun. 1989] pp. 249–254.

Keutzer, Kurt "DAGON: Technology Binding and Local Optimization by DAG Matching," 24$^{th}$ ACM/IEEE Design Conference, Jun. 1987, pp. 341–347.

De Micheli," Technology Mapping of Digital Circuits," 5$^{th}$ Annual European Computer Conference, May 1991, pp. 580–586.

Bartlet, Karen A. et al., "Library Specific Optimization of Multilevel Combinational Logic," IEEE, [Jun. 1985] pp. 411–415.

Bergamaschi, Reinaldo A., "Automatic Synthesis and Technology Mapping of Combinational Logic," IEEE, [May 1988], pp. 466–469.

Nöth, Winfried, et al., "TROY: A Tree Based Approach to Logic Synthesis and Technology Mapping," VLSI. 1996 6$^{th}$ Great Lakes Symposium [Jan. 1996,] pp. 188–193.

Lega, Mario C., "Mapping Properties of Multi–Level Logic Synbthesis Operations," Computer Design 1988 International Conference, [May 1988], pp. 257–261.

Brayton, R.K., "Algorithms for Multi–Level Logic Synthesis and Optimization," NATO Advanced Study Institute on Logic Synthesis and Silicon Complication for VLSI Design, Jul. 1986, pp. 197–248.

*Primary Examiner*—Vincent N. Trans
*Assistant Examiner*—Herbert McNair
*Attorney, Agent, or Firm*—Ronald C. Hudgens; Arthur W. Fisher

[57] ABSTRACT

A method for translating a boolean function into a logic circuit using gates from a standard library is provided. The method includes the steps of translating the boolean function into a network comprising a plurality of sub-trees, where each of the sub-trees represents a portion of the function, and where each sub-tree includes a plurality of representations for that portion of the function. The plurality of representations are stored in an alterative logic diagram, which comprises a plurality of ugates. The ugates are data structures which define the inputs and the connectivity of the respective ugate in the sub-tree. The sub-tree is mapped to gates from the standard library by selecting the best sub-tree representation. Accordingly, an improved method of logic synthesis is provided that allows for the optimal representation to be provided by starting with a wider range of inputs to the mapping process.

9 Claims, 6 Drawing Sheets

IMPLICIT TREE-MAPPING TECHNIQUE

BACKGROUND OF THE INVENTION

This invention relates generally to the design of integrated circuits and more specifically to integrated circuit design using logic synthesis techniques.

As it is known in the art, a modern large-scale CMOS integrated circuit comprises over a million transistors. Even allowing for the fact that many are mere replications of others, designing that many transistors is a daunting task. Thus, logic synthesis tools have been provided to automate the circuit design process. Logic synthesis tools are rule based or algorithmic processes that are used to translate boolean logic functions into circuit schematics. Synthesis tools are able to provide a completed design in a time period which is orders of magnitudes faster than a manual design.

Unfortunately, a drawback with synthesized designs is that the quality of the design is not as high as that of a manual design. Thus historically synthesized designs could only be used in fairly uncritical areas of the circuit, where circuit speed and area were not severely constrained.

Logic synthesis is usually divided into two phases. In the technology independent phase, the circuit is represented by boolean functions. The functions are simplified and put in a "good form", usually comprising a boolean network of two input AND gates (henceforth referred to as AND2 gates) and inverters. Then, in the technology mapping phase, the boolean network is translated into physical gates of a designated standard library by a technology mapper.

A fundamental problem lies in determining which is the optimum "form" for the boolean network. A typical boolean function may be presented in a number different, equally accurate AND2/inverter representations. Some of these representations may translate more optimally to the designated library than others. However, no fixed method has been provided for determining which of the representations will translate better (in terms of area and speed) into gates without trying them all.

Thus in providing the optimum representation for a given boolean function there is a bottleneck. Because only one representation may be passed to the technology mapper, there is a high probability that the ideal representation will not be determined for the network.

One could avoid the above problem by passing many possible AND2/inverter representations of the boolean function from the technology independent phase to the technology mapper. The technology mapper would translate each representation into gates and retain the best result.

However, one problem with the above technique is that there are limits to the amount of time available to synthesize a logic design. For any given boolean function, there may easily be billions of AND2/inverter representations that perform the same function. To attempt to map all of the available representations for the given function is simply not feasible given the time constraints of the computer manufacturing process. To attempt to map fewer of the available representations provides a less than optimal result.

An additional problem lies in the timing implications of the boolean function. Generally, because the technology independent phase disregards any external information such as the timing of the input signals to the boolean function, it has been historically limited in its ability to accommodate design constraints.

SUMMARY OF THE INVENTION

According to one aspect of the invention, a method for translating a boolean function into a logic circuit using gates from a standard library is provided. The method includes the steps of translating the boolean function into a network of interconnected two-input AND gates and inverters called an alternative logic diagram. The alternative logic diagram is represented by a set of ugates. Each ugate describes a subset of the two-input AND gates and inverters and defines their interconnectivity within the network. The purpose of an alternative logic diagram is to compactly describe a set of trees of two-input AND gates and inverters which are logically equivalent to the original boolean function. Accordingly, with such an arrangement, an improved method of logic synthesis is provided that allows for the optimal representation to be provided by starting with a wider range of inputs to the mapping process. Because a wider range of representations is provided to the mapping process, the synthesis tool has the added flexibility of optimizing to meet timing and/or area constraints of a logic circuit.

BRIEF DESCRIPTION OF THE DRAWINGS

The above-mentioned and other features of the invention will now become more apparent by reference to the following description taken in connection with the accompanying drawings in which.

DESCRIPTION OF THE PREFERRED EMBODIMENT

Figure 1:
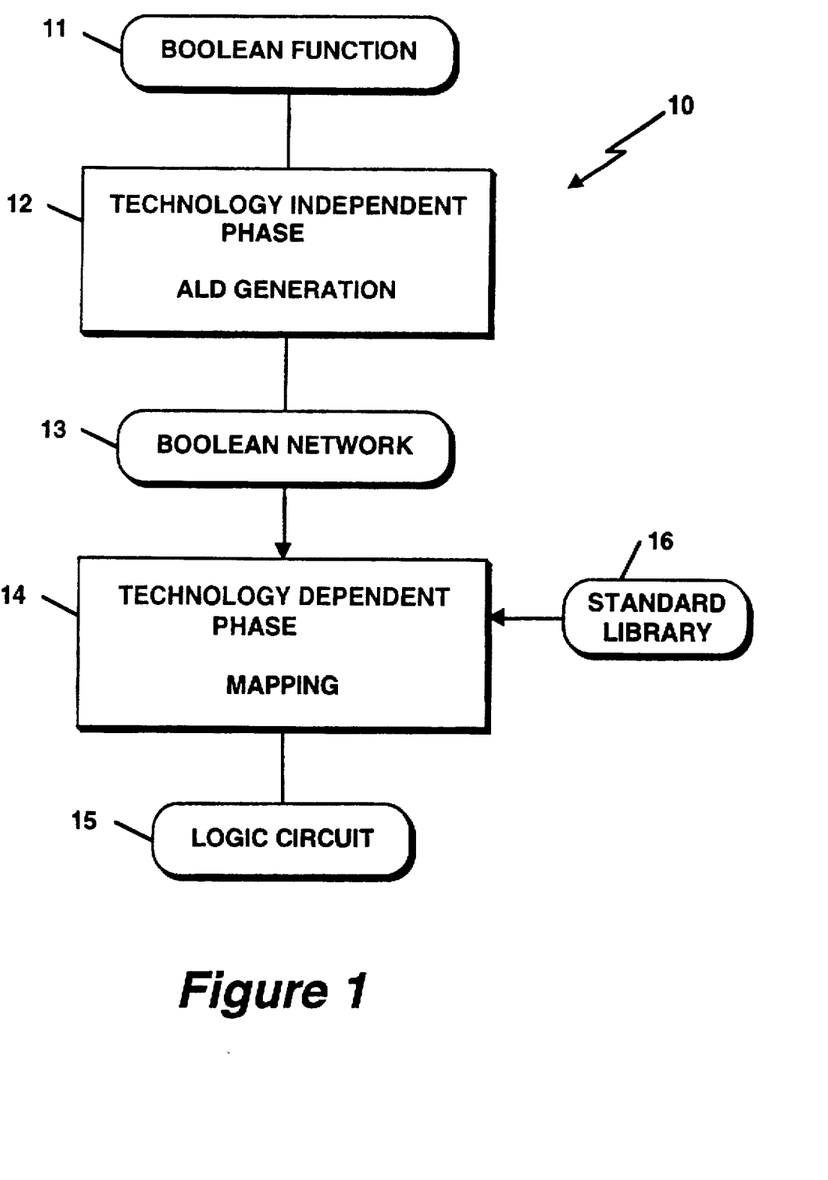
FIG. 1 is a flow diagram illustrating the basic flow of a design using logic synthesis.

Referring now to FIG. 1, the logic synthesis process 10 typically includes two discrete phases of design; a technology independent boolean translation process 12, and a technology dependent mapping process 14.

A boolean function 11 is input to the boolean translation process 12. The boolean translation process 12 operates to translate the boolean function 11 into a technology independent boolean network 13, using AND gates and inverters. According to the present invention, the boolean network 13, which is passed to the technology dependent phase 14, is built from a group of Alternative Logic Diagrams (ALD). Each ALD includes a plurality of representations for different components of the boolean network 13, as will be described in more detail later herein.

The boolean network 13 is then passed to the technology dependent phase 14. During the technology dependent phase of the synthesis process, the boolean network 13 is translated into a logic circuit using gates from a standard library 16. The standard library includes a group of gates that have been custom built by the designers. Various segments of the boolean network are 'covered' using gates from the standard library during the mapping process. By 'cover' it is meant that components, or groups of components, in the boolean network having a given functionality are replaced by gates from the standard library capable of performing the same function. Dynamic programming is used to compute the least cost cover of the boolean network via patterns representing gates from the standard library. The method used for covering in the present invention is "implicit" in that the run time is not proportional to the number of encoded trees, which may be large or even infinite.

Figure 2A:
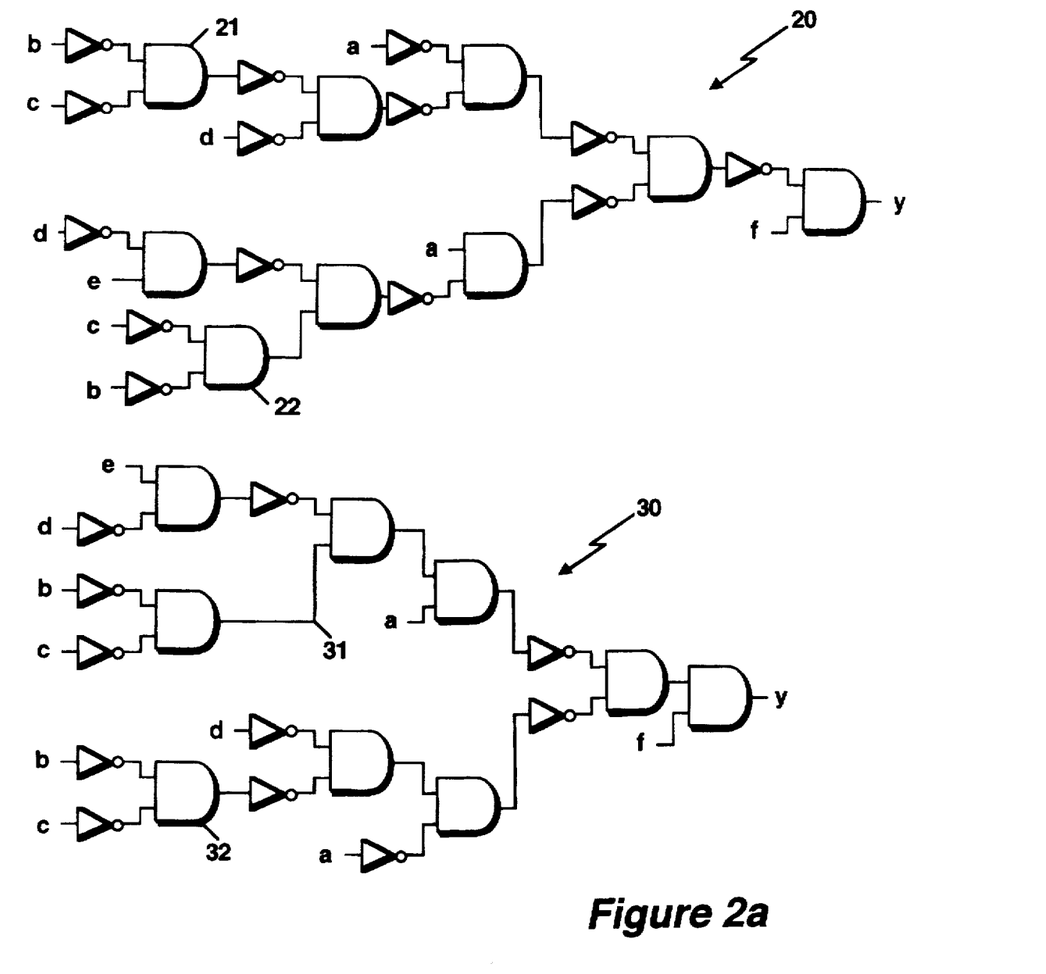
FIGS. 2A–2C are logic diagrams used to describe the construction of an Alternative Logic Diagram (ALD) during the technology independent phase of the logic synthesis process illustrated in FIG. 1.
Figure 2B:
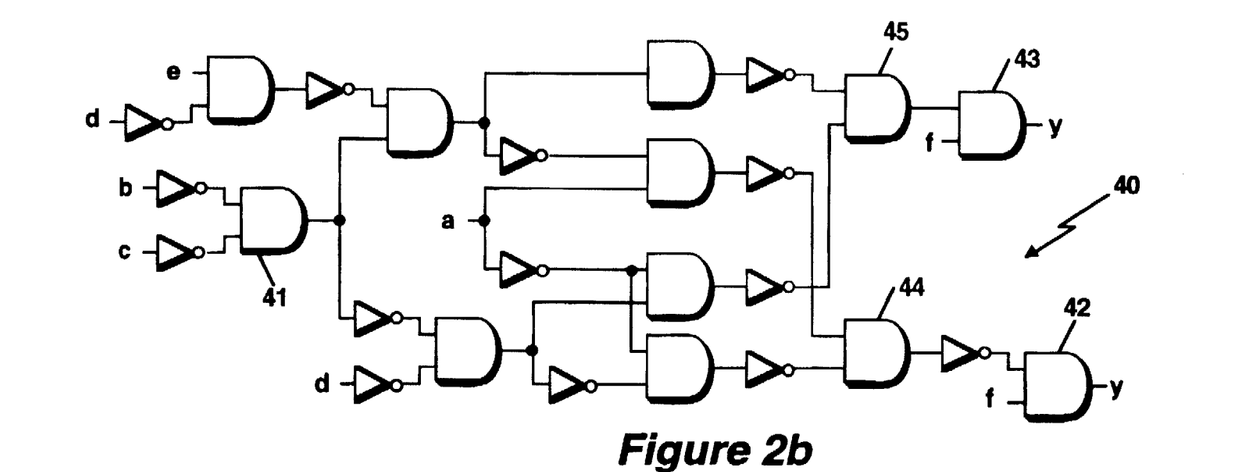
Figure 2C:
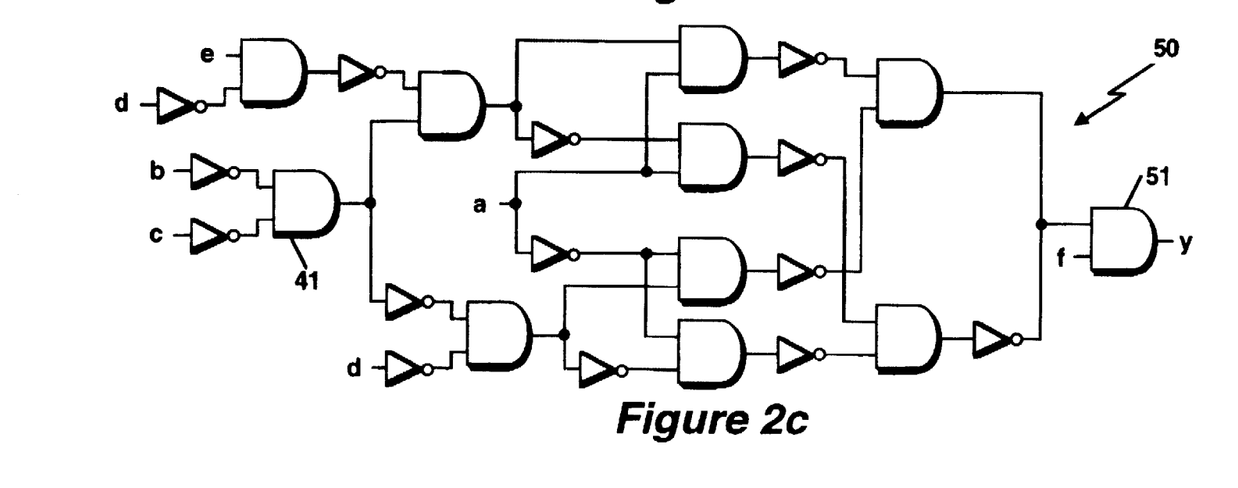

Referring now to FIGS. 2A–2C, an example of a boolean translation process is shown. The circuit schematics of FIG. 2A illustrates two logically equivalent AND2/inverter tree representations of the boolean function, designated as 20 and 30, each capable of generating the function 'y'. Thus the mapping process is improved because a sizable set of alternative representations is considered in computing the least cost cover. According to the present invention, both representations are encoded as compactly as possible into a single Alternative Logic Diagram (ALD) in the following manner.

An ALD is an extension of the typical AND2/inverter tree, with three advantages. First, an ALD may include fanout points. A fanout point arises when more than one node in a tree network receives input from the same source. If a boolean function is represented by several AND2/inverter trees, there may be common sub-expressions. For example, in AND2/inverter tree representation 20, the common sub-expression (~b AND ~c) is calculated by both AND gate 21 and AND gate 22. In AND2/inverter tree representation 30, the same sub-expression is calculated by AND gates 31 and 32. To consolidate the two representations the common substructures are merged, creating fanout points. The effects of such a merger are found in FIG. 2B. As can be seen in FIG. 2B, both representations 20 and 30 are encoded as compactly as possible into one alternative logic diagram. The common sub-expression (~b AND ~c) of representations 20 and 30 are merged as AND gate 41 in the ALD 40. By merging common substructures, the representations are presented in a more compact form, thus preserving memory space. In addition, because the time required to complete the technology mapping process is usually proportional to the size of the ALD, reducing the number of nodes in the ALD not only saves memory, but also reduces the time required to complete the mapping process.

The second difference between an ALD and prior art AND2/inverter trees is that ALD's may contain fanin points. If several AND2/inverter forms of a boolean function are available, the outputs of these representations may fan in together. If a common sub-expression appears in several forms, the outputs may fanin together, and then fan out wherever any representation was used.

For example, referring now to FIG. 2C, it can be seen that the AND gate 43 in the representation 40 of FIG. 2B provides an output which is logically equivalent to the AND gate 42. Thus, the outputs from the AND gates 45 and 44 may be merged, and replaced with one AND gate as shown in FIG. 2C as AND gate 51 in the AND2/inverter network 50. There are two advantages to merging the outputs of logically equivalent gates. First, as shown in FIG. 2C, the size of the ALD can be reduced. As mentioned previously, reducing the size of the ALD reduces the time required for the mapping process. A second advantage to merging the fanout points is that it increases the set of available encoded AND2/inverter representations.

For example, referring again briefly to FIG. 2A, suppose the two logically equivalent AND2/inverter representations 20 and 30 (hereinafter referred to as TREE1 and TREE2, respectively) were sub-trees in a larger AND2/inverter tree. Initially, the sub-trees connect into the larger tree at two different points, POINTX and POINTY. By merging outputs, as shown in the transformation between FIG. 2B and FIG. 2C, the number of AND2/inverter encodings is quadrupled. Thus, instead of being forced to connect TREE1 to POINTX, and TREE2 to POINTY, there are also the options of connecting TREE1 to both points or TREE2 to both points or TREE1 to POINTY or TREE2 to POINTX. By having more encoded representations, the mapping process is able to obtain better results.

The third characteristic of an ALD that differentiates it from the typical AND2/inverter network is that an ALD may include cycle information. A cycle arises when each of the two functions may be written in terms of the other. The cycle information describes the relationship between the two functions. More details as to how cycles are analyzed in the ALD will be described later herein.

Figure 3:
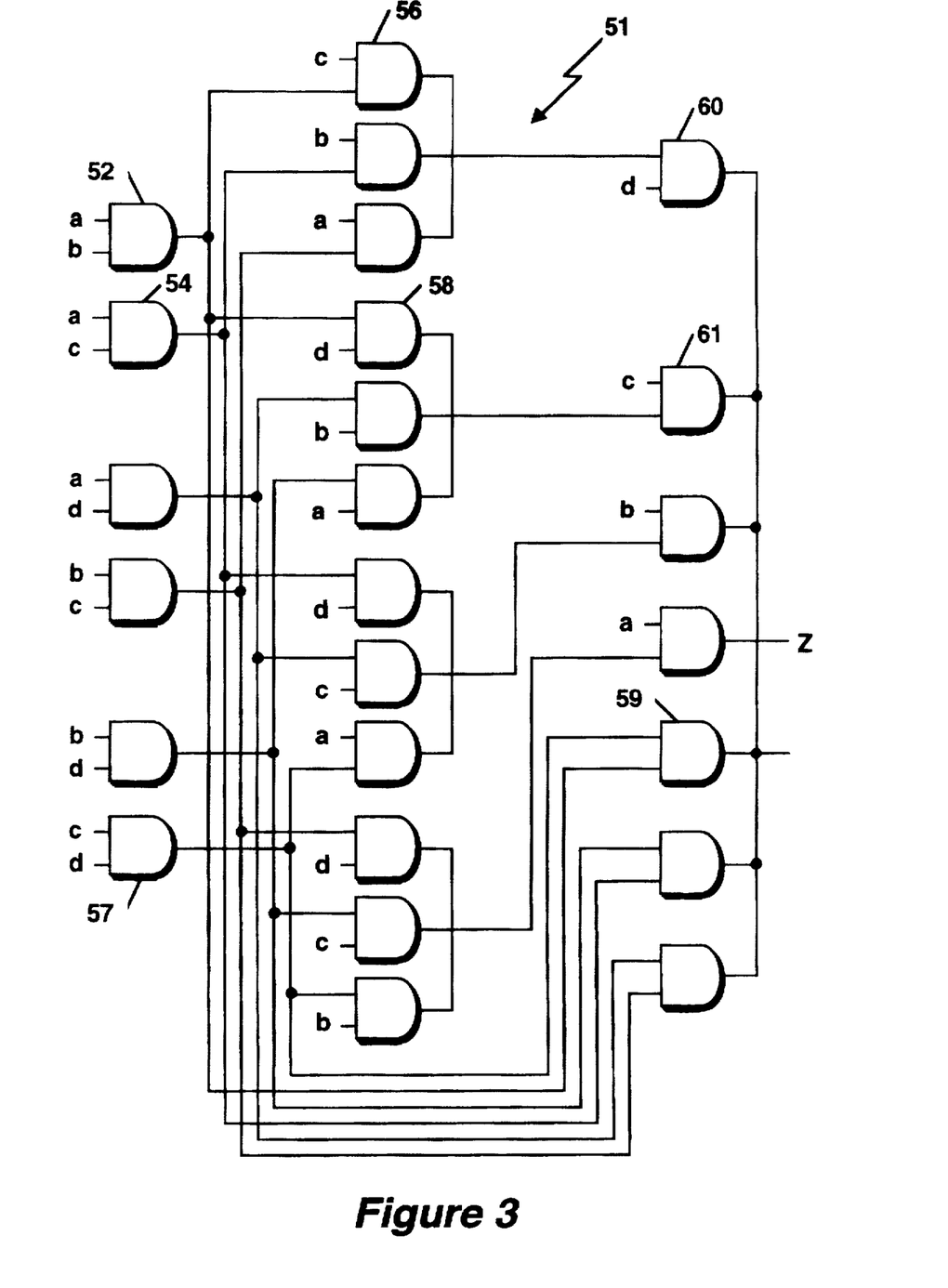
FIG. 3 is a logic diagram illustrating an ALD for a 4 input AND gate.

Referring now to FIG. 3, an example of an ALD encoding of a 4 input AND gate is shown. The decompositions of the multi-input AND were encoded as follows. First, Fanin points were created corresponding to each subset of two or more inputs. Thus, for the boolean function (z=a AND b AND c AND d), the fanin points comprise the unique pairs of combinations of a, b, c and d, comprising the set {a AND b, a AND c, a AND d, b AND c, b AND d, and c AND d}. An AND gate is then generated and attached to each of the unique pairs of fanin signals, with AND gate 52 coupled to signal a and signal b, AND gate 54 coupled to signal a and signal c, etc. However, there are still inputs remaining to form the final representation, and these remaining signals are fanin signals which may be coupled to more AND gates. For example, output a AND b from gate 52 could be combined with the signal c (accomplished via AND gate 56), or with the signal d (accomplished via AND gate 58), or by combining the output with the output from AND gate 57 (which evaluates c AND d) at AND gate 59. The output from the evaluation (a AND b) AND c by gate 56 is then combined with input signal d at AND gate 60. Similarly, the output from the evaluation (a AND b) AND d by gate 58 is then combined with input signal c at AND gate 61.

Because the ALD encoding provides a variety of different representations for the above boolean function, the optimum representation in terms of available signals, timing of available signal, and area may be provided. Thus, for example, if the input signal 'c' is a 'late' signal, in terms of its available timing constraints, a representation using gate 61 could be selected. By allowing the technology dependent portion of the logic synthesis operation to accommodate representations with different timing implications, a significant step has been taken to improve the representations provided by the logic synthesis tools.

It should be noted, however, that although the ALD has been shown in FIGS. 2 and 3, as comprising a plurality of AND2 and/or inverter gates, it is not feasible to encode all the decompositions of a boolean function using a model similar to the structures shown due to memory constraints.

To overcome this problem, the present invention uses a plurality of 'ugate' data structures which are coupled together to represent an ALD. In the present invention there are two forms of ugates used to build the ALD; the INPUT ugate and the AND ugate, although it should be understood that other types of ugates may be constructed pursuant to the following teachings. These ugates are coupled together in a linked list format to form the ALD for a given boolean function. The parameters of the ugate data structure are used to derive the set of ALD nodes representing the boolean function.

Figure 4:
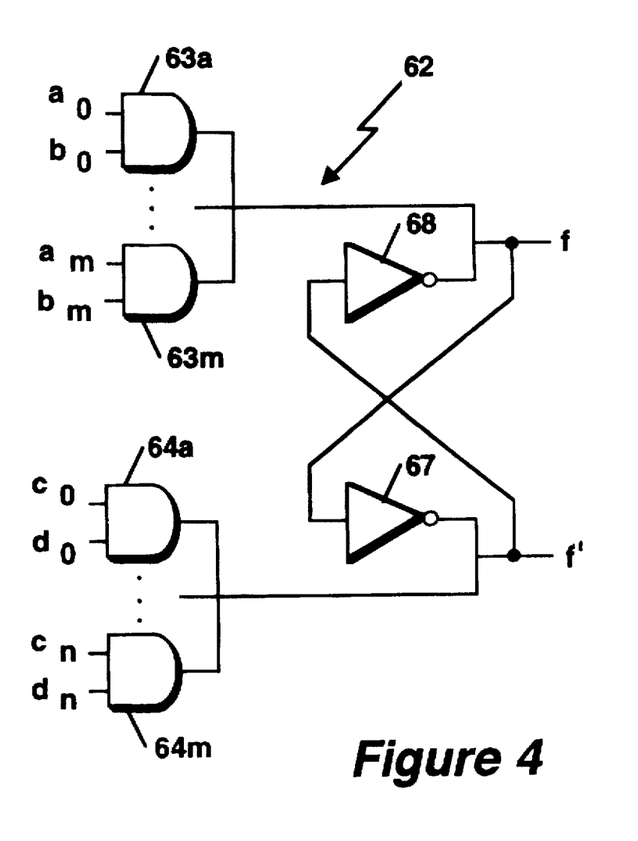
FIG. 4 is an example of a ugate used in constructing the ALDs, such as that shown in FIG. 3, via the technology independent phase of the logic synthesis process illustrated in FIG. 1.

For example, referring now to FIG. 4, an example of the AND ugate 62 and the INPUT ugate 66 are shown. The INPUT ugate 66 is coupled to input signal to the boolean function to allow an input to be inverted an arbitrary number of times. By providing different 'flavors' of the input signal, different configurations of the boolean function may be provided that may map to different components of the standard library, thereby facilitating the derivation of the optimal representation during the mapping process.

The AND ugate 62 represents the output function f and f' as an AND of simpler functions followed by an arbitrary length inverter chain in all possible configurations. The configuration of the AND ugate assumes that:

$$f = a_0 b_0 = \ldots = a_m b_m = \ldots = C_0 d_0 = \ldots = C_n d_n$$

$$f' = C_0 d_0 = \ldots = C_n d_n = \ldots = \overline{(a_0 b_0)} = \ldots = \overline{(a_m b_m)}$$

Where m+1 is the number of AND gates required to satisfy the above fanin requirements for the function f, and where n+1 is the number of AND gates required to satisfy the fanin requirement for the function f'. Thus, to put it another way, an AND2 is provided in the top portion of the AND ugate for every each of the (m+1) known ways of representing f as an AND of two other functions, and an AND2 is provided in the bottom portion for each of the (n+1) known ways of representing f' as the AND of two other functions.

Encoding the ALD via ugates provides many advantages to the logic synthesis process. First, because the cycle of inverters (67,68) encodes the notion of an arbitrary length inverter chain, it can be ensured that the set of possible matches from the standard library is not restricted by the lack of the appropriate 'flavor' of input signal. Second, purely combinatorial ALDs can be represented entirely with interconnected ugates. This is a major implementation efficiency, because it reduces the amount of memory space required to store the potential representations for the boolean function. For example, encoding all decompositions of an eight input AND would require 18,150 ALD nodes (assuming there are two inverters between ALD's to provide the proper 'flavor' input to the following ALD in the tree). In contrast, the same eight input AND can be implemented using only 119 ugates.

An example of a ugate data structure is shown below, defined in the programming language C:

```
typdef struct ugate_struct{
    ugate_type type;
    int cost[2];
    int inputs [2];
    struct ugate_struct **input[2];
    struct ugate_struct **next;
} ugate_t;
```

Where the fields of the structures have the following definitions. The 'type' field indicates if the ugate is an INPUT type or an AND gate type. The 'inputs' field describes the number of AND gates in the ugate. Thus, for the INPUT ugate, inputs[0]=inputs[1]=0. For the AND ugate, inputs[0]=the number of AND gates in the top half of the ugate (m+1), and inputs[1]=the number of AND gates in the bottom half of the ugate (n+1).

The 'costs' field is used during the forward, cost computation pass of the mapping process, which will be described in further detail later herein. Note that there are 2 values for the cost field. These two cost values reflect the costs incurred in generating each of the polarities of the output signal (f and f').

The "input" field is a memory address to an array of ugate pointers. Thus, for the AND ugate, input[0] points to a block of memory which would include a group of pointers to the inputs of each of the AND gates in the upper half of the ugate. For example, using the notation from FIG. 4, the contents of the memory block indicated by input [0] would be: {A0, B0, ..., Am, Bm}. Similarly, input[1] is a memory address of a block of memory including a group of pointer to the inputs of each of the AND gates in the lower half of the ugate. Thus, the contents of the memory block pointed to by input [1] would be {C0, D0, ..., Cn, Dn}.

The 'next' field is used to keep the ugates in a linked list for purposes of initializing cost variables on all the ugates, and so that none of the created ugates gets lost. It should be noted, however, that the [next] field does not include connectivity information. Rather, all of the information defining the connectivity between the various ugates is defined by the 'input' field of the structure.

Because a ugate provides both polarities of output signals to the next ugate in the tree, some mechanism must be provided to ensure that the appropriate output polarity of a ugate is coupled as the input to a coupled ugate. The present invention overcomes this problem by taking advantage of the fact that, since most machines require data to be aligned on even byte boundaries, the lower data bit is typically unused. The present invention uses this extra bit to transform the [input] pointer, which defines the connectivity of the ugate, into a signed pointer. Such an arrangement allows for the correct polarity signal to be forwarded from the output of one ugate to the input of the next.

Once the appropriate ALDs have been provided for the boolean network, in terms of ugates, the logic synthesis tool may proceed to map, or 'cover' the ALD with components from the standard library.

Figure 5:
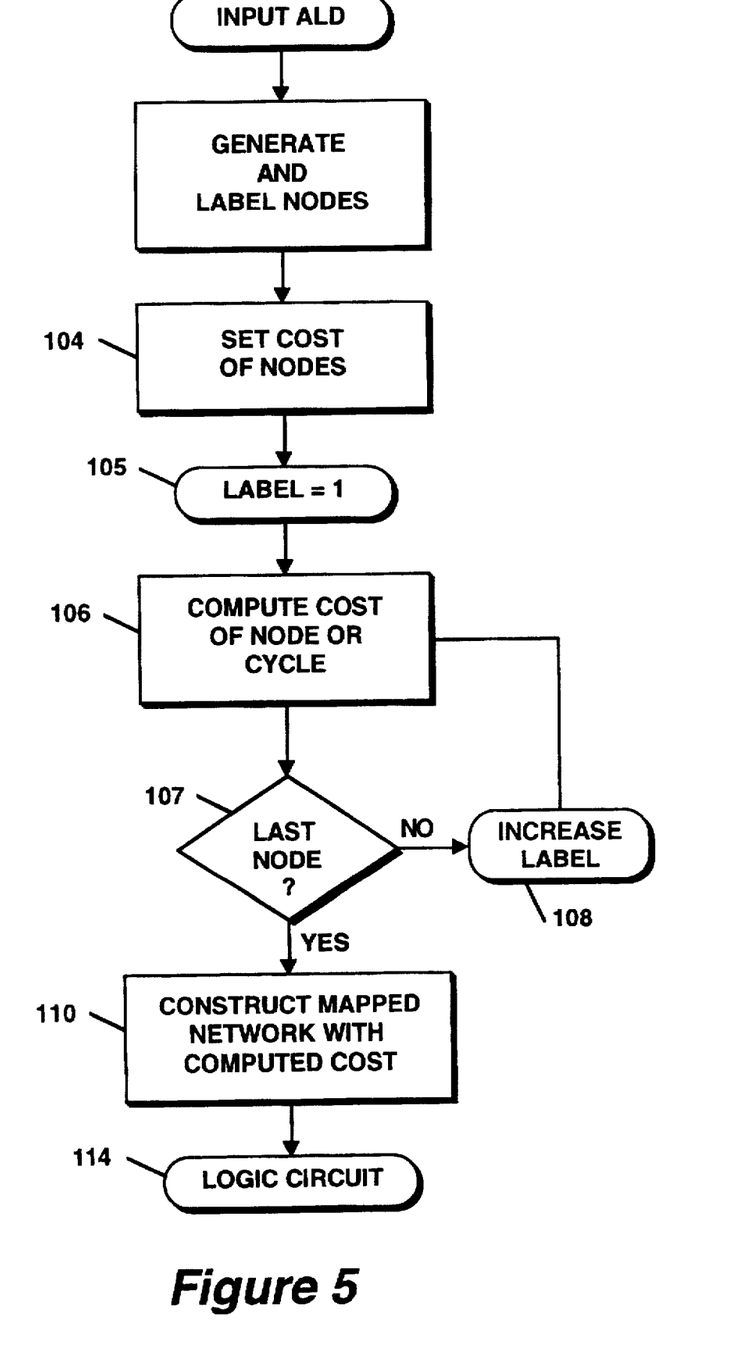
FIG. 5 is a flow diagram illustrating the process used to map the ALDs, comprising ugates, to gates of a standard library during the technology dependent phase of logic synthesis shown in FIG. 1.

Referring now to FIG. 5, the method according to the invention calculates the least cost cover of the ALD in the following manner. At step 100, the completed ALD is input to the mapping process. The mapping process operates from the [leaves] of the ALD inward to the output signal, or the 'root' of the ALD. As the process maps from the leaves to the root, 'nodes' identifying the gates of the boolean network 13 are identified. At step 102, as each node is identified, it is labeled in a depth-first search from the input node. The nodes are labeled according to the below restrictions, where m and n are nodes in an ALD, and 'n' is the node in question, and [m] is an adjoining node in the sub-tree rooted at n:

(1) label(n)<label(m) if there is only a directed path from n to m (2) label(n)=label(m) if there is also a directed path from m to n (3) label(n)!=label(m) if there is no directed path between n and m At each node [n], two values are maintained; cost(n) which represents the cost of the least-cost cover for any encoded sub-tree rooted at node [n], and the label(n) which is stored as an integer value. It should be noted that restriction (2) ensures that all nodes in a cycle are treated as a single node and thus receive the same label.

At step 104, an initial cost is assigned to each primary input. If the object of the mapping is to minimize area, the initial cost of the input is 0. If the object of the mapping is to minimize timing, the initial cost of the input is the arrival time of the signal at the respective node. The cost of the internal nodes is initialized to some value, such as infinity, which indicates that the costs of the nodes is undetermined.

At step 105, a process of traversing through the network is commenced by evaluating the mapping at the node labeled |1|, (which will include the node or nodes at the leaves of the tree) and continuing to the output node, or |root| of the tree. At step 106, at each node, a cost is computed for that node via an 'Update' function. In the Update function, all the potential matches for each node are identified and a cost for each match is computed. The cost for each node is a combination of the cost of the node as defined in the ugate structure, added to the cumulative costs of previously visited nodes. Each library gate pattern is matched at n in all possible ways. The costs on nodes at the inputs of each match are combined with gate information to give the cost of covers rooted at node n. Only the best cover (i.e. minimum in terms of area, or delay, depending on the type of minimization being performed), is retained.

It should be noted that, for all nodes having a common label, and thus being in the same cycle, the cost is iteratively evaluated until it has stabilized before the process continues to the next node. Costs on the ugates in a cycle are said to have stabilized when calling Update on any ugate in the cycle leaves the cost of that ugate unchanged.

At step 107, it is determined whether there are any more nodes to be evaluated. If there are, the process proceeds to step 108 where the label value is increased by one. Then the cost of the nodes with the newly increased label are computed in the manner described above. The steps of 106 through 108 repeat until all of the nodes in the tree have been evaluated.

Once all costs have been computed by working from inputs to output, at step 110 a second output to input pass is made to construct the solution with the computed best cost.

Accordingly it can be seen that through the use of a simple ugate data structure, an alternative logic diagram may be maintained for any portion of a boolean network. By providing a plurality of alternatives to the technology mapper, the performance of the logic synthesis tool is greatly enhanced. In addition, the ALD provides the flexibility of allowing the representation to be optimized in terms of either area or timing.

Having described the preferred embodiments of the invention, it will now become apparent to those of ordinary skill in the art that other embodiments incorporating its concepts may be provided. It is felt therefore that this invention should not be limited to the disclosed embodiments, but rather should be limited only by the spirit and scope of the claims.

What we claim is:

1. A method comprising the steps of:

deriving a logic circuit for a given function, said logic circuit capable of being implemented in a standard library, said step of deriving further comprising the steps of:

translating said function into a network comprising a plurality of sub-trees, each of said sub-trees representing a portion of said function, each of said sub-trees including a plurality of logically equivalent representations for said portion of said function;

mapping said network into a logic circuit comprising gates from said standard library, said step of mapping including the step of selecting, at each of said sub-trees, responsive to a desired optimization criteria, one of said plurality of logically equivalent representations for said corresponding portion of said function;

wherein each one of said plurality of logically equivalent representations is stored in a corresponding alternative logic data structure, and wherein said alternative logic data structure further comprises a plurality of ugates.

2. The method according to claim 1, wherein each of said ugates is a data structure, and wherein said method further comprises the step of identifying, at each of said ugates, input signals to said corresponding ugate, said identifying information being stored in said corresponding data structure.

3. The method according to claim 2, wherein said step of identifying further comprises the steps of:

storing, at a memory address indicated by said corresponding data structure, a list of input signals to said ugate; and indicating the polarity of each of said input signals.

4. The method according to claim 3, wherein said step of indicating further comprises the step of dedicating an unused bit of said corresponding memory address as a sign value for indicating said polarity of said input signals.

5. The method according to claim 2, further including the step of identifying, at each of said ugate data structures, connected ugates in the alternative logic diagram.

6. The method according to claim 5, wherein each of said ugate data structures stores a cost value, indicating the cost in terms of area of the corresponding ugate.

7. The method according to claim 1, wherein said step of selecting one of said possible logically equivalent representations further comprises the steps of:

determining, for each sub-tree, a plurality of components of said standard library that match any of said plurality of logically equivalent representations of said sub-tree;

computing a cost of each of said plurality of components of said standard library, said cost derived from said ugates of said sub-tree; and selecting said component of said standard library having the lowest cost.

8. An apparatus for translating a boolean function into a logic circuit having components from a standard library, said apparatus comprising:

means for translating said boolean function into a tree network, said tree network including a plurality of different logically equivalent representations for said boolean function;

means for storing said plurality of different logically equivalent representations for said boolean function, said representations stored in the form of ugate data structures, each of said ugate data structures including a memory pointer for indicating where in memory inputs to said respective logically equivalent representations are stored; and means for selecting one of said different logically equivalent representations responsive to a desired optimization criteria to provide said logic circuit.

9. The apparatus according to claim 8, wherein said means for storing further comprises means for determining a polarity of input signals to said ugate by examining one of the bits of said memory address.

* * * * *